United States Patent [19]

Masaki et al.

[11] Patent Number: 5,449,950

[45] Date of Patent: Sep. 12, 1995

[54] PHOTOSENSOR WITH ORGANIC AND INORGANIC INSULATION LAYERS

[75] Inventors: Yuichi Masaki, Kawasaki; Masaki Fukaya, Yokohama; Teruhiko Furushima, Hiratsuka; Katsunori Terada, Tokyo; Seiji Kakimoto, Yokohama, all of Japan

[73] Assignee: Canon Kabushiki Kaisha, Tokyo, Japan

[21] Appl. No.: 232,432

[22] Filed: Apr. 21, 1994

Related U.S. Application Data

[63] Continuation of Ser. No. 924,576, Aug. 5, 1992, abandoned, which is a continuation of Ser. No. 563,784, Aug. 6, 1990, abandoned, which is a continuation of Ser. No. 263,988, Oct. 27, 1988, abandoned, which is a continuation of Ser. No. 719,966, Apr. 4, 1985, abandoned.

[30] Foreign Application Priority Data

Apr. 16, 1984 [JP] Japan ............................... 59-74907
Apr. 16, 1984 [JP] Japan ............................... 59-74912

[51] Int. Cl.$^6$ .................... H01L 27/46; H01L 31/048
[52] U.S. Cl. ........................... 257/643; 257/72; 257/433; 257/639; 257/649; 257/640
[58] Field of Search .............. 357/30, 72; 257/433, 257/448, 643, 640, 638, 639, 649, 72

[56] References Cited

U.S. PATENT DOCUMENTS

| | | | |
|---|---|---|---|
| 3,788,895 | 1/1974 | Schimmer et al. | 357/52 |
| 3,916,073 | 10/1975 | Horowitz et al. | 357/52 |
| 4,048,502 | 9/1977 | Gudden | 357/52 |
| 4,064,289 | 12/1977 | Yokoyama et al. | 357/52 |
| 4,271,425 | 6/1981 | Wong | 357/52 |
| 4,577,390 | 3/1986 | Haken | 357/54 |
| 4,581,099 | 4/1986 | Fukaya et al. | |

FOREIGN PATENT DOCUMENTS

| | | | |
|---|---|---|---|
| 2548060 | 12/1977 | Germany | 357/54 |
| 3141000 | 6/1982 | Germany | 357/54 |
| 59-52872 | 3/1984 | Japan | 357/30 K |

*Primary Examiner*—Jerome Jackson
*Attorney, Agent, or Firm*—Fitzpatrick, Cella, Harper & Scinto

[57] ABSTRACT

A photosensor includes a substrate; a photoconductive layer formed on the substrate; a pair of electrodes mounted on and electrically connected to the photoconductive layer; a light reception portion formed between the electrodes; and a protective layer formed on the light reception portion; wherein an organic silicon film with a small content of metal ion is formed at least at the uppermost portion of the protective layer.

5 Claims, 2 Drawing Sheets

PHOTOSENSOR WITH ORGANIC AND INORGANIC INSULATION LAYERS

This application is a continuation of application Ser. No. 07/924,576 filed Aug. 5, 1992, abandoned which is a continuation of Ser. No. 07/563,784 filed Aug. 6, 1990 abandoned, which is a continuation of Ser. No. 07/263,988 filed Oct. 27, 1988 abandoned, which is a continuation of Ser. NO. 06/719,966 filed Apr. 4, 1985 abandoned.

BACKGROUND OF THE INVENTION

1. Field of the Invention

The present invention relates to a highly reliable photosensor and a method of manufacturing the photosensor with ease.

2. Description of the Prior Art

Conventionally, silicon photodiode type linear photosensor arrays are generally known in the art as photoelectric conversion means which constitute a readout section of, for example, a facsimile apparatus or a copier. This type of linear photosensor is difficult to manufacture in an elongated form due to the limits in the size of a monocrystal available. Therefore, it is necessary to optically scale down an original to be optically scanned, thereby resulting in a disadvantage in miniaturizing the apparatus.

Apart from the above, extensive development in the technology for making elongated and large-scale photosensors has been made recently using film forming methods, such as glow discharge method, sputtering method, ion plating method, and vacuum evaporation method, or a method for coating a mixture of binding resin and semiconductor material.

A planar type photoconductive photosensor may be given as one example of photosensors constituting an elongated line sensor, in which a pair of metal electrodes are formed on a photoconductive layer, such as chalcogenide, CdS, CdS-Se, and amorphous silicon (hereinafter referred to as a-Si), the pair of metal electrodes being disposed on the photoconductive layer facing each other so as to form a gap serving as a light reception portion.

One example of the structures of conventional photoconductive photosensors is shown in FIG. 1. The structure includes a substrate 11, photoconductive layer 12 with non-doped impurities, ohmic contact layer 13, conductive layers 14-1, 14-2 serving as electrodes, light reception portion 15, and protective layer 16 of SiNH.

With this structure of conventional photosensors, a glow discharge device is required for forming a passivation film. In addition, film forming processes take a long time. Therefore, productivity is low. Moreover, since a substrate must be subjected to heating for a long time for forming an SiNH film, heat hysteresis may become one of The causes of inconsistent sensor characteristics.

SUMMARY OF THE INVENTION

It is an object of the present invention to provide a photosensor which has the protective performance substantially the same as a SiNH layer and has a high productivity and stable properties.

It is another object of the present invention to provide a photosensor and a method of manufacturing the photosensor. The photosensor comprises a substrate; a photoconductive layer formed on the substrate; a pair of electrodes mounted on and electrically connected to the photoconductive layer; a light reception portion formed between the electrodes; and a protective layer formed on the light reception portion, wherein an organic silicone film with a small content of metal ion is formed at least at the uppermost portion of the protective layer.

DETAILED DESCRIPTION OF PREFERRED EMBODIMENTS

Embodiments of the present invention will now be described with reference to the accompanying drawings.

Figure 1:
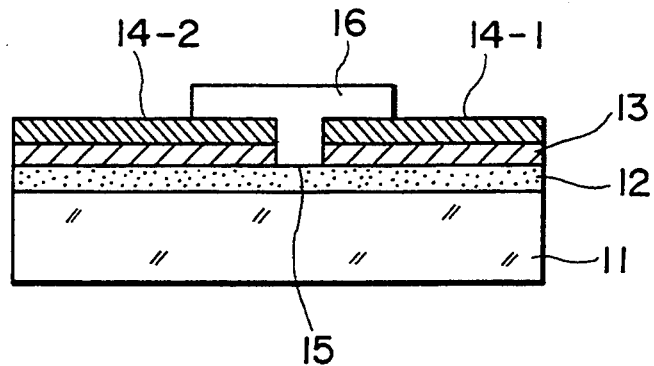
FIG. 1 is an elevational cross section showing the structure of a conventional photosensor.
Figure 2:
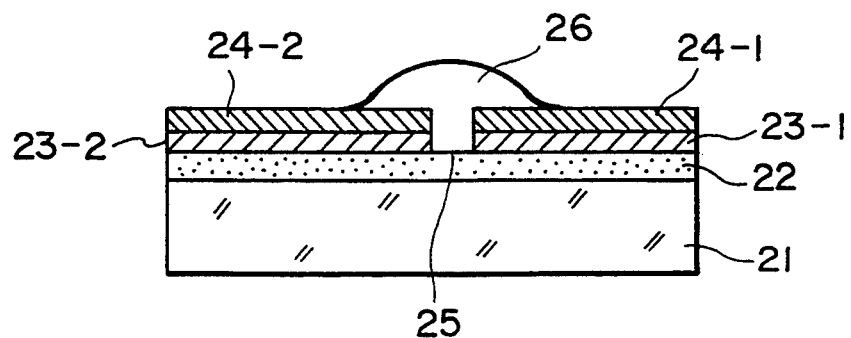
FIG. 2 is an elevational cross section of a first embodiment of the photosensor according to the present invention.
Figure 3:
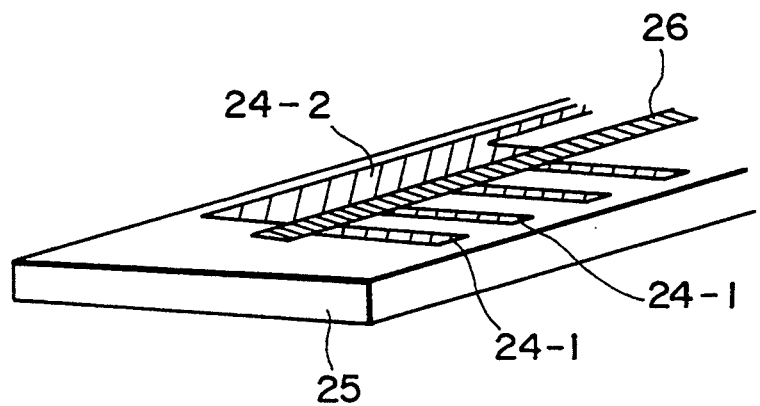
FIG. 3 is a perspective view of the structure shown in FIG. 2.

A first embodiment is shown in FIGS. 2 and 3. The photosensor shown in FIGS. 2 and 3 comprises a substrate 21 made of Corning #7059 glass (manufactured by Corning Company), photoconductive layers 22 not intentionally doped impurities, ohmic contact layer 23-1, 23-2, electrically conductive layers 24-1, 24-2 respectively serving as electrodes, light reception portion 25, and protective layer 26. The protective layer 26, as described later in detail, is made of an organic silicone film with a small content of metal ion.

The photosensor shown in FIGS. 2 and 3 was manufactured, for instance, as in the following.

A Corning #7059 glass plate (commodity name: manufactured by Corning Company) was utilized as the substrate 21 which was placed in a capacitance coupled type glow discharge decomposition device and was heated to 200° C. under an exaust vacuum of $1 \times 10^{-6}$ Torr. Next, $SiH_4$ gas (manufactured by Komatsu Electronic Company) of an epitaxial grade purity was introduced into a glow discharge deposition layer forming device at a flow rate of 10 SCCM thereby to set the gas pressure at 0.1 Torr. Thereafter, using a high frequency power source at 13.56 MHz, a glow discharge was attained with an input voltage of 0.4 KV and RF power of 8 W. Approximately in 2 hours, a 1 μm non-doped a-Si layer, i.e., the photoconductive layer 22 with not intentionally doped impurities was formed on the substrate 21.

Thereafter, glow discharge decomposition under the same conditions as above was effected with a gas mixture (hereinafter represented by $PH_3$ (5000/$SiH_4$)) produced by diluting $PH_3$ with $SiH_4$ at 5000 ppm in order to form phosphorus-doped a-Si layers, i.e., the ohmic contact layers 23-1, 23-2 of 0.1 thickness.

Next, in order to form the light reception portion 25 of a width of 150 microns and the pair of electrodes 24-1, 24-2, an aluminum film was vapor-deposited upon the ohmic contact layers. Thereafter, dry etching was performed in a dry etching device using $CF_4$ gas to remove a portion of the ohmic layer located at the light reception portion 25 thereby to realize the light reception portion 25.

The above structure was implemented using the same processes as for the conventional photosensor. That is, using a screen printing method, JCR 6102 (commodity name for a reactive silicon resin, manufactured by Toray Silicone Company) with Na content smaller than 3 ppm was coated on a photoelectric conversion section (about 2 mm width and 250 mm length) with a plurality of light reception portions 25 disposed in an array. Thereafter, heating for 1 hour at 70° C. and 2 hours at 150° C. was performed to complete hardening. The method for coating the protective film 26 may be carried out using a dispenser.

Figure 4:
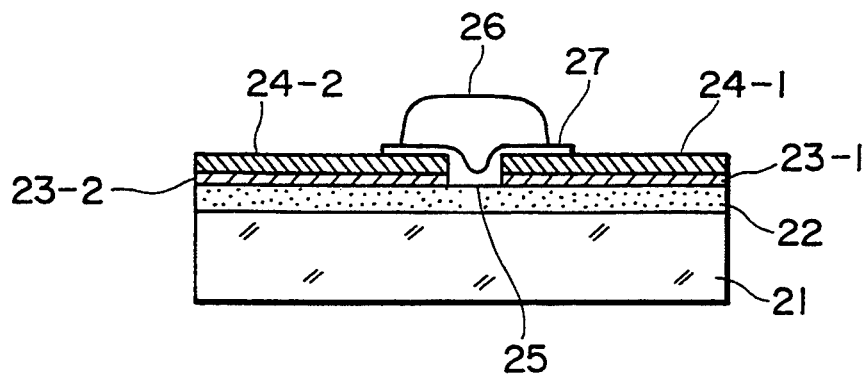
FIG. 4 is an elevational cross section of a second embodiment of the photosensor according to the present invention.
Figure 5:
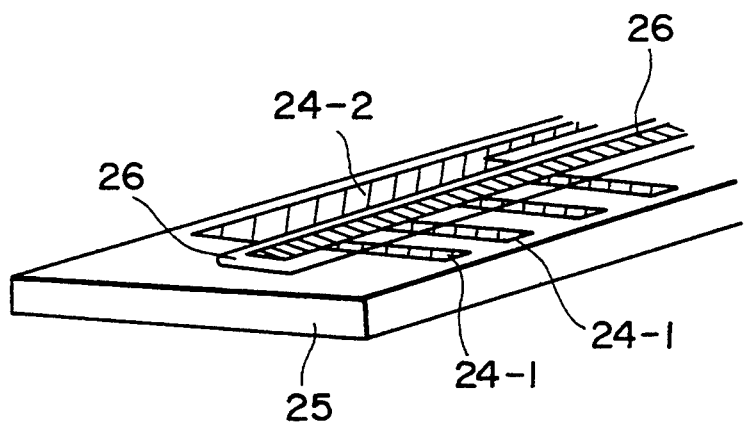
FIG. 5 is a perspective view of the structure shown in FIG. 4.

FIGS. 4 and 5 show another example of the embodiments of the present invention. The photosensor of the example shown therein comprises a substrate 21, photoconductive layer 22 with not intentionally doped impurities, electrically conductive layers 24-1, 24-2 respectively serving as electrodes, light reception portion 25, and a protective layer of laminated construction for covering the light reception portion 25, the laminated protective layer comprising an inorganic insulation film 27, such as SiNH and an organic silicone film 26 formed on the inorganic insulation film 27.

The forming of the inorganic insulation film 27 using, for example, an SiNH film was performed as in the following. The processes up to the formation of the light reception portion 25 and the organic silicone film 26 are the same as for the photosensor shown in FIGS. 2 and 3.

An SiNH film of about 1000 Å thickness was formed using a gas mixture of $SiH_4$ gas and $NH_3$ gas by subjecting the gas mixture to glow discharge decomposition under the same conditions as for the formation of the photoconductive layer 22 (except its layer forming time was 1 hour). In this case, it is preferable that the relation between the film thickness $d_1$ of the inorganic insulation film and the film thickness $d_2$ of the organic silicon film is $d_2 \geq d_1$. For comparison purposes, a conventional type photosensor was manufactured in such a way that the processes up to the formation of the light reception portion 25 were the same as those for the photosensor of the present invention and that an SiNH film as a protective film was formed to a thickness of 5000 Å.

The durability was tested for two photosensors having the protective film formed in accordance with the present invention, and for the conventional type photosensor having as a protective layer only an SiNH film. In particular, the three (3) specimens were subjected under the conditions of 60° C., 95% relative humidity for 1000 hours. It was recognized that the three specimens were equal in reliability. The variations in characteristics before and after the protective film forming step were observed, and it was found that the stability of the photosensor according to the present invention was superior as compared with the conventional one only with an SiNH film.

In the above example, although an SiNH film has been used for forming an inorganic insulation layer, it should be understood that other materials, such as $SiO_2$, SiO, $Al_2O_3$ are also applicable.

Effects of the Invention (1) The time for film forming is short and the cycle time is improved so that the productivity is improved.

(2) The time required for high temperature processing is shortened, a longer time otherwise having an adverse effect upon the photosensor characteristics.

(3) Low price organic silicon material can be used, thereby resulting in reduction of the cost.

What is claimed is:

1. A photosensor array comprising plural photoreceiving units arranged in an array, each of which comprises a photoconducting layer of amorphous silicon formed on a substrate and at least a pair of electrodes provided through an ohmic contact layer on the photoconducting layer, wherein, between at least the pair of electrodes on said photoconducting layer, an inorganic insulating layer, and a silicone resin layer with a thickness greater than that of said inorganic insulating layer are formed, in this order.

2. A photosensor array according to claim 1, wherein said silicone resin layer includes Na of a concentration not greater than 3 ppm.

3. A photosensor array according to claim 1, wherein said inorganic insulating layer is made of a material selected from a group comprising silicon nitride, silicon oxide, and aluminum oxide.

4. A photosensor array according to claim 3, wherein said silicon nitride includes $Si_3N_4$.

5. A photosensor array according to claim 1, wherein said ohmic contact layer is an amorphous silicon layer including phosphorus.

* * * * *

UNITED STATES PATENT AND TRADEMARK OFFICE
CERTIFICATE OF CORRECTION

PATENT NO. : 5,449,950

DATED : September 12, 1995

INVENTOR(S) : YUICHI MASAKI, ET AL.

It is certified that error appears in the above-identified patent and that said Letters Patent is hereby corrected as shown below:

ON TITLE PAGE

In [57] ABSTRACT:

Line 6, "silicon" should read --silicone--.

COLUMN 1

Line 6, "abandoned" should read -abandoned,--.
Line 10, "NO." should read --No.--.
Line 57, "The" should read --the--.

COLUMN 2

Line 31, "not" should read --with not--.
Line 44, "exaust" should read --exhaust--.

COLUMN 3

Line 6, "silicon" should read --silicone--.
Line 39, "silicon" should read --silicone--.

UNITED STATES PATENT AND TRADEMARK OFFICE
CERTIFICATE OF CORRECTION

PATENT NO. : 5,449,950
DATED : September 12, 1995
INVENTOR(S) : YUICHI MASAKI, ET AL.

It is certified that error appears in the above-identified patent and that said Letters Patent is hereby corrected as shown below:

COLUMN 4

Line 22, "silicon" should read --silicone--.

Signed and Sealed this

Sixteenth Day of April, 1996

BRUCE LEHMAN

Attest:

Attesting Officer

Commissioner of Patents and Trademarks